US007838465B2

(12) United States Patent
Dou et al.

(10) Patent No.: US 7,838,465 B2
(45) Date of Patent: Nov. 23, 2010

(54) METHOD OF SYNTHESIS OF A SUPERCONDUCTING MATERIAL

(75) Inventors: Shi Xue Dou, Keiraville (AU); Hau Kun Liu, Keiraville (AU); Alexey Vladimirovich Pan, Wollongong (AU); Sihai Zhou, Gwynneville (AU); Mihail Horia Ionescu, Woonona (AU)

(73) Assignee: University of Wollongong, Wollongong, New South Wales ( * ) Notice: Subject to any disclaimer, the term of this patent is extended or adjusted under 35 U.S.C. 154(b) by 0 days.

(21) Appl. No.: 12/553,778

(22) Filed: Sep. 3, 2009

(65) Prior Publication Data

US 2010/0081573 A1 Apr. 1, 2010

Related U.S. Application Data

(62) Division of application No. 10/518,948, filed as application No. PCT/AU03/00758 on Jun. 18, 2003, now abandoned.

(30) Foreign Application Priority Data

Jun. 18, 2002 (AU) .................................. PS 3057

(51) Int. Cl.
H01B 12/00 (2006.01)
(52) U.S. Cl. .............. 505/500; 505/100; 423/289; 148/96; 420/901
(58) Field of Classification Search .......... 505/100, 505/124, 500, 805; 420/901; 148/96; 423/276, 423/289
See application file for complete search history.

(56) References Cited

U.S. PATENT DOCUMENTS

| 4,988,669 A | 1/1991 | Dersch |
| 6,511,943 B1 | 1/2003 | Serquis et al. |
| 6,946,428 B2 | 9/2005 | Rey |

FOREIGN PATENT DOCUMENTS

| EP | 0 292 340 A1 | 11/1988 |
| EP | 0 427 209 A2 | 5/1991 |
| JP | 64-003009 A | 1/1989 |
| JP | 01-157452 | 6/1989 |
| JP | 02-068820 A | 3/1990 |
| JP | 02-129812 A | 5/1990 |
| JP | 03-153558 A | 7/1991 |

(Continued)

OTHER PUBLICATIONS

Zhou et al "Effect of the processing parameters of MgB1.8(SiC)0.1/Fe tapes . . . " Physica C 387 (May 2003) 321-327.*

(Continued)

*Primary Examiner*—Mark Kopec
(74) *Attorney, Agent, or Firm*—Fitch, Even, Tabin & Flannery (57) ABSTRACT

A method of synthesizing a superconducting material, comprising mixing starting materials comprising magnesium, boron, silicon and carbon; heating the mixture of starting materials to a temperature in the range between 650° C. and 2000° C. to produce a material comprising magnesium boride doped with silicon carbide; and cooling the resulting material to a temperature below the critical temperature of the material to render the material capable of superconducting.

22 Claims, 6 Drawing Sheets

FOREIGN PATENT DOCUMENTS

| JP | 06-256018 A | 9/1994 |
| --- | --- | --- |
| JP | 2002-352648 | 12/2002 |
| WO | 02/055435 A1 | 7/2002 |
| WO | 02/069353 A1 | 9/2002 |
| WO | 02/072501 A2 | 9/2002 |
| WO | 02/098794 A1 | 12/2002 |
| WO | 03/049208 A2 | 6/2003 |

OTHER PUBLICATIONS

Horvat et al "Magnetic shielding in MgB2/Fe superconducting wires", Los Almos National Laboratory, Preprint Archive, Condensed Matter (Jul. 2002) 1-4.*

Cimberle, M.R. et al., Magnetic characterization of sintered MgB2 samples: effect of substitution or 'doping' with Li, Al and Si, Superconductor Science and Technology, 2002, vol. 15, pp. 43-47, 10P Publishing, UK. Pub Jan. 2002.

Prikhna, Tatiana et al., Positive Influence of Ta Addition on Superconductive Properties of High Pressure Synthesized MgB2, Los Alamos National Laboratory Preprint Archive, 2002, Condensed Matter, pp. 1-7.

Tampieri, A. et al., Effects of Cu and Other Metallic Dopings on the Superconducting Properties of MgB2, International Journal of Modern Physics B, vol. 17, Nos. 4, 5 & 6 (2003), pp. 438-445, World Scientific Publishing Company, Singapore.

Suo, H. L. et al., High Transport Critical. Currents in Dense Monofilamentary Fe- and Ni-Clad MgB2 Tapes and MgB2/Fe Wires with 7 Flaments, IEEE Transactions on Applied Superconductivity, vol. 12, No. 1, Mar. 2002, pp. 1079-1083.

Dou, S. X. et al., Superconductivity, critical current density and flux pinning in MgB2-x(SiC)x/2 superconductor after SiC nanoparticle doping, Journal of Applied Physics, vol. 94, Issue 3, Aug. 2003, pp. 1850-1856.

Jiang, C. H. and Kumakura, H., Stoichiometry dependence of the critical current density in pure and non-SiC doped MgB2/Fe tapes, Physics C: Superconductivity, vol. 451, Issue 1, Jan. 2007, pp. 71-76.

Dou, Shi. X. et al., Transport Critical Current Density in Fe-Sheathed Nano-SiC Doped MgB2 Wires, IEEE Transactions on Applied Superconductivity, vol. 13, No. 2, Jun. 2003 (3199-3202).

He, T. et al., Reactivity of MgB2 with common substrate and electronic materials, Applied Physics Letters, Jan. 14, 2002, vol. 80 Issue 2, p291.

Zeng, Xianghui, et al., In Situ epitaxial MgB2 thin films for superconducting electronic, Nature Materials, vol. 1, Sep. 2002, pp. 1-4.

Zhao, Y. et al., High Critical Current Density of MgB2 Bulk Superconduxtor Doped with Ti and sintered at ambient pressure, Applied Physics Letters, U.S.A., Aug. 20, 2001, vol. 79, No. 8, pp. 1154-1156.

Beneduce, C. et al. "Transport Critical Current, Anisotrophy, Irreversibility Fields and Exponential $n$ Factors in Fe Sheathed $MgB_2$ Tapes", Mar. 27, 2002, arXiv.org/abs/cond-mat/0203551.

Bud'Ko, S.L. et al,, "Boron Isotype Effect in Superconducting $MgB_2$", The American Physical Society, 2001, vol. 86, No. 9, pp. 1877-1880.

Bugoslavsky, Y. et al,, "Enhancement of the High-Magnetic-Field Critical Current Density of Superconducting $MgB_2$ by Proton Irradiation", Macmillan Magazines Ltd, Nature, 2001, vol. 411, pp. 561-563.

Bugoslavsky, Y. et al., "Vortex Dynamics in Superconducting $MgB_2$ and Prospects for Applications", Macmillan Magazines Ltd, Nature, 2001, vol. 410, pp. 563-565.

Dou, S.X. et al., "Flux Jumping and a Bulk-to-Granular Transition in the Magnetization of a Compacted and Sintered $MgB_2$ Superconductor", Physica C, 2001, vol. 361, pp. 79-83.

Eom, C.B. et al., "High Critical Current Density and Enhanced Irreversibility Field in Superconducting $MgB_2$ Thin Films", Macmillan Magazines Ltd, Nature, 2001, vol. 411, pp. 558-560.

Flukiger, R. et al., "Superconducting Properties of $MgB_2$ Tapes and Wires", Physica C, 2003, vol. 385, pp. 286-305.

Goldacker, W. et al., "High Transport Currents in Mechanically Reinforced $MgB_2$ Wire", Institute of Physics Publishing, Supercond. Sci. Technol. 2001, vol. 14, pp. 787-793.

Kang, W.N. et al., "$MgB_2$ Superconducting Thin Films with a Transition Temperature of 39 Kelvin", Science, vol. 292, 2001, pp. 1521-1523.

Jin, S. et al., "High Critical Currents in Iron-Clad Superconducting $MgB_2$ Wires", Macmillan Magazines Ltd, Nature, 2001, vol. 411, pp. 563-565.

Larbalestier, D.C. et al., "Strongly Linked Current Flow in Polycrystalline Forms of the Superconductor $MgB_2$", Macmillan Magazines Ltd, Nature, 2001, vol. 410, pp. 186-189.

Mickelson, W. et al., "Effects of Carbon Doping on Superconductivity in Magnesium Diboride", The American Physical Society, Physical Review B, 2002, vol. 65, pp. 052505-1-052505-3.

Nagamatsu, Jun et al., "Superconductivity at 39K in Magnesium Diboride", Macmillan Magazines Ltd, Nature, 2001, vol. 410, pp. 63-64.

Prikhna, T.A. et al., "High-Pressure Synthesis of $MgB_2$ with Addition of Ti", arxiv.org/con-mat/0306013, Nov. 8, 2002, pp. 1-17.

Wang, J. et al., "High Critical Current Density and Improved Irreversibility Field in Bulk $MgB_2$ Made by a Scaleable Nanoparticle Addition Route", Applied Physics Letters, 2002, vol. 81, No. 11, pp. 2026-2028.

Wang, X.L. et al., "Very Fast Formation of Superconducting $MgB_2$/Fe Wires with High $Jc$", Physica C, 2001, vol. 361, pp. 149-155.

Zhou, Sihai et al., "Effects of Precursor Powders and Sintering Processes on the Superconducting Properties of $MgB_2$", Institute of Physics Publishing, Superconductor Science and Technology, 2004, vol. 17, pp. S528-S532.

* cited by examiner

METHOD OF SYNTHESIS OF A SUPERCONDUCTING MATERIAL

CROSS-REFERENCES TO RELATED APPLICATIONS

This application is a divisional of U.S. patent application Ser. No. 10/518,948, filed on Jun. 10, 2005, now abandoned, which is a U.S. National phase application of International application No. PCT/AU03/00758 filed Jun. 18, 2003, designating the United States, which claims benefit to Australian application No. PS 3057 filed Jun. 18, 2002, the contents of which incorporated herein by reference in their entirety.

FIELD OF THE INVENTION

The present invention relates to a superconducting compound and to a method of synthesizing a superconducting compound, and, particularly, but not exclusively, a superconducting compound based on magnesium diboride and a method of synthesis thereof.

BACKGROUND OF THE INVENTION

Significant progress has been made in improving the critical current density ($J_c$) in various forms of $MgB_2$ since superconductivity in this compound was discovered [1]. $MgB_2$ exhibits the superconducting characteristics and physics of BCS-type LTS (low-temperature superconductor) materials, as evidenced for example by a significant isotope effect [2]; however, its critical temperature ($T_c$) is more than twice those of the presently used superconductors $Nb_3Sn$ and $Nb_3Al$, and more than four times that of the present LTS workhorse, NbTi. The importance of $MgB_2$ lies in its simple crystal structure, high critical temperature $T_c$, high critical current density ($J_c$), and large coherence length (hence transparency of grain boundaries to current flow). These properties of $MgB_2$ offer the promise of important large-scale and electronic device applications. High $J_c$ at a level of $10^5$ A/cm$^2$ to $10^6$ A/cm$^2$ at 20 K to 30 K for $MgB_2$ wires have been reported by several groups [3-8]. However, $J_c$ drops rapidly with increasing magnetic field. In all the studies on wires and bulk made from $MgB_2$, $J_c$ decreased more than 90% of its zero field value at 3 T within this temperature range due to the poor pinning ability of this material. If $MgB_2$ is to be useful in high fields, the flux pinning strength must be improved. Attempts to enhance flux pinning have resulted in an encouraging improvement in irreversibility fields ($H_{irr}$) and $J_c(H)$ performance in high fields by oxygen alloying in $MgB_2$ thin films [9, 10] and by proton irradiation of $MgB_2$ powder [11].

However, there has been some conjecture as to whether effective pinning centres can be introduced into $MgB_2$ bulk or wires by a normal process such as chemical doping.

Several attempts have been made to improve flux pinning using chemical doping, but the results remain controversial. Furthermore, the results for doping into $MgB_2$ are largely limited to addition rather than substitution. Zhao et al., have doped $MgB_2$ with Ti and Zr, showing improvement of $J_c$ in self field [12]. However, there is evidence for improved pinning as the $J_c$ drops off rapidly with increasing field ($H_{irr}$=4T at 20 K). Recently, Wang et al doped $MgB_2$ using nanoparticles [13]. The results showed an improvement of irreversibility field ($H_{irr}$) at 4.2 K for the doped sample. However, Hirr for the doped samples is not as good as the undoped ones at 20 K. Cimerle et al., found that doping with a small amount of Li, Al and Si showed some increase in $J_c$, but there is no improvement in $H_{irr}$ [14].

SUMMARY OF THE INVENTION

In accordance with a first aspect, the present invention provides a superconducting material of formula $MgB_xSi_yC_z$ where X is a number in the range between 0 to 2, Y is a number in the range between 0 to 1 and Z is a number in the range 0 to 1, and where the sum of X, Y and Z is greater than or equal to 2.

Preferably, X=1 to 2, Y=0.05 to 0.5 and Z=0.05 to 0.5.

More preferably, X=1.2 to 1.8, Y=0.1 to 0.3 and Z=0.1 to 0.3.

Advantageously, the factors of critical current density, irreversibility field and flux pinning properties of $MgB_2$ are significantly improved by chemical doping with SiC, potentially paving the way for $MgB_2$ to replace the current market leaders NbTi and Ag/Bi2223.

It will be understood that a superconducting material in accordance with the present invention may preferably be made into superconducting bulk, wires, thin films and various articles and devices for any superconducting application.

In accordance with a second aspect, the present invention provides a superconductor incorporating the superconducting material of the first aspect of the invention.

In accordance with a third aspect the present invention provides a method of synthesizing the superconducting material of the first aspect of the present invention, comprising the step of utilizing starting materials Mg, B, Si and C. Preferably, these are in powder form. Preferably, the powders consist of nanoparticles.

In accordance with a fourth aspect, the present invention provides a method of synthesizing the superconducting material of the first aspect of the invention comprising the steps of utilizing starting materials Mg, B and SiC. Preferably, these are in powder form. Preferably, the powders consist of nanoparticles.

In accordance with a fifth aspect, the present invention provides a method of synthesizing a superconducting material in accordance with the first aspect of the invention comprising the step of utilizing starting materials $MgB_2$ and SiC or Si and C. Preferably, these are in powder form. Preferably the powders consist of nanoparticles.

More broadly, in accordance with a sixth aspect, the present invention provides a method of producing a superconducting material, comprising the step of adding silicon carbide to a superconducting material.

Preferably, the silicon carbide is added by way of addition.

Preferably, the silicon carbide is added by way of substitution.

The silicon carbide may be added both by substitution and addition to the superconducting material.

In accordance with a seventh aspect, the present invention comprises a superconducting material including a silicon carbide codopant.

In an eighth aspect, the present invention provides a method of manufacturing a material capable of functioning as a superconductor, comprising the steps of, mixing elemental magnesium and elemental boron with an amount of one or more of the group comprising silicon carbide and titanium carbide, and heating the powders to sinter the powders into a material capable of functioning as a superconductor.

In a ninth aspect, the present invention provides a method of manufacturing a material capable of operating as a superconductor, comprising the steps of, mixing elemental magnesium and elemental boron with an amount of one or more of the group comprising elemental silicon, elemental titanium and elemental carbon, and heating the mixture to sinter the mixture into a material capable of functioning as a superconductor.

Preferably, the mixture is heated to a temperature in the range from 650° to 2000° C. More preferably, the temperature is in the range 750°-900° C.

Preferably, the elements are provided in a powder form.

Preferably, the powders consist of nanoparticles.

Preferably, the powders are groove-rolled into a tube manufactured from a material of one or more of the group comprising iron (Fe), copper (Cu), nickel (Ni) and stainless steel tube prior to heating the mixture.

Preferably, the method comprises the further step of cooling the resultant material to the temperature of liquid nitrogen, to render the material capable of superconducting.

In a tenth aspect, the present invention provides a superconducting material of the formula of formula $MgB_xSi_yC_z$ where X is a number in the range between 0 to 2, Y is a number in the range between 0 to 1 and Z is a number in the range 0 to 1, where the sum of X, Y and Z is greater than or equal to 2, and X is greater than 0.

BRIEF DESCRIPTION OF THE DRAWINGS

Preferred features and advantages of the present invention will become apparent from the following description of examples thereof, by way of example only, with reference to the accompanying figures, in which.

DESCRIPTION OF EXAMPLES AND PREFERRED EMBODIMENTS

The superconducting composition and the processes for synthesis of the materials of the present invention can significantly enhance Jc and flux pinning. The results which are described hereinbelow demonstrate that the claimed formula can be used for fabrication of superconductors for high-field applications, as chemical doping is a readily achievable and economically viable route to introduce effective flux pinning.

$MgB_2$ pellet samples were prepared by a reaction in-situ method which has been previously described [16]. Powders of magnesium (99% purity) and amorphous boron (99% purity) were well mixed with a SiC additive with the weight ratio of (Mg+2B) $(SiC)_x$ where x=0, 0.055, 0.11, 0.22 and 0.33 for samples 1 to 5 respectively (Table 1).

The mixed powders were loaded into Fe tubes. The composite tubes were groove-rolled, sealed in a Fe tube and then directly heated at preset temperatures to 950° C. for 3 hours, in the presence of flowing high purity Ar. This was followed by quenching with liquid nitrogen. Table 1 gives the samples parameters and selected results of $T_c$ and $H_{irr}$.

The magnetization of samples was measured over a temperature range of 5 to 30 K using Magnetic Property Measurement System (MPMS) and a Physical Property Measurement System (PPMS, Quantum Design) in a time-varying magnetic field of sweep rate 50 Oe/s and amplitude 5T and 9T, respectively. A magnetic $J_c$ can be derived from this measurement.

Figure 1:
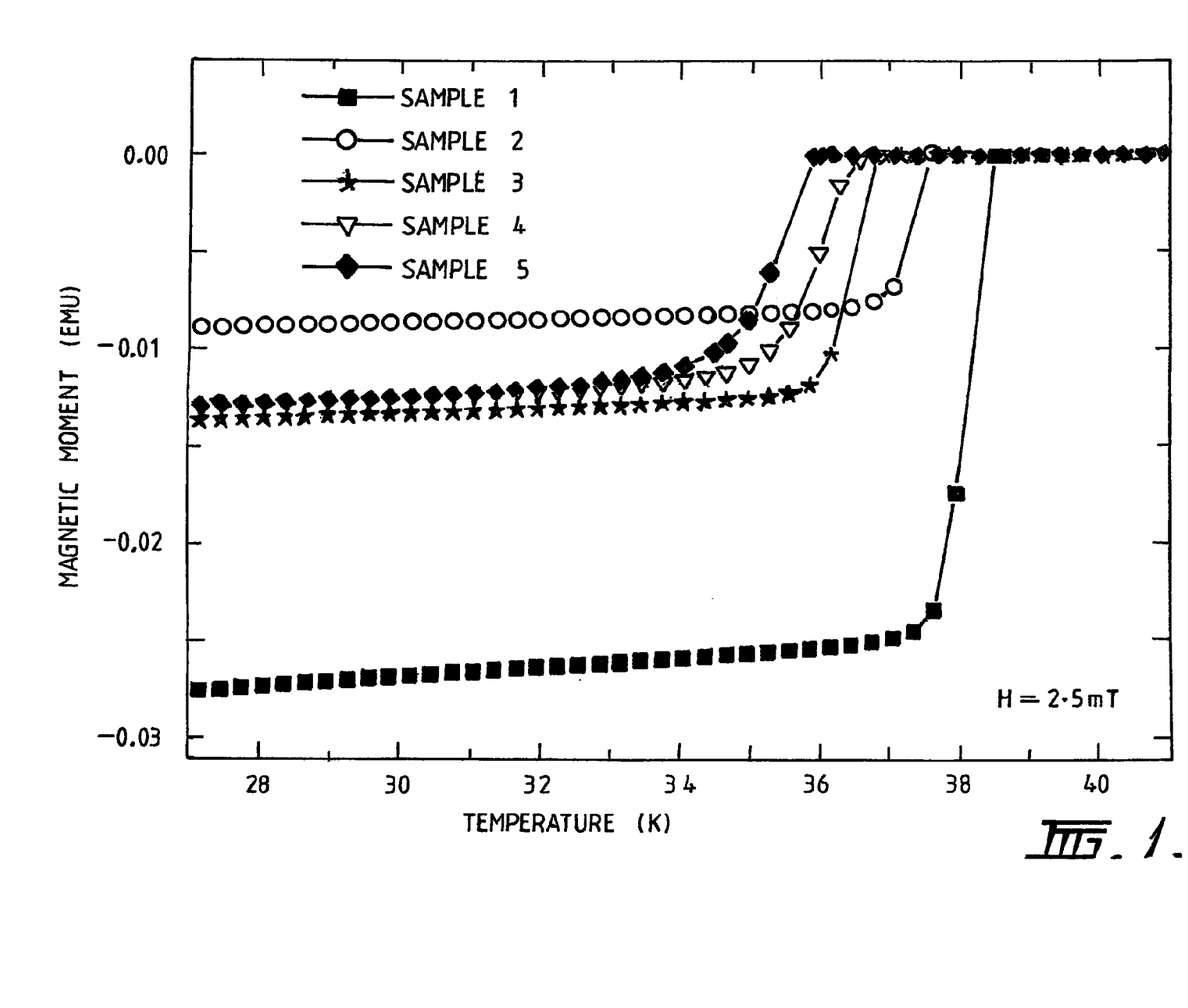
FIG. 1 is a graph depicting the Critical transition temperature ($T_c$) measured using magnetic susceptibility versus temperature for $MgB_2$ $(SiC)_x$ where x=0, 0.055, 0.11, 0.22 and 0.33.

FIG. 1 depicts the transition temperature ($T_c$) and transition width $\Delta T_c$ for the doped and undoped samples determined by AC susceptibility measurements. The $T_c$ onset for the undoped sample (38.6 K) is the same as reported by a number of groups. For the doped samples, the $T_c$ decreases with increasing doping level. It is striking to note that despite the large amount of non-superconducting phases present, the $T_c$ only drops 2.6 K at an SiC doping level of x=0.33 (33 at % of B). In contrast, the $T_c$ was depressed for almost 10 K by 7% C substitution for B in $MgB_2$ [17] and 0.5 at % Si substitution reduced $T_c$ for about 0.5 K [14] These results suggest that the higher tolerance of $T_c$ of $MgB_2$ to SiC doping is attributable to the co-doping of C and Si because the average size of C (0.077 nm) and Si (0.117 nm) is similar to that of B (0.097 nm). It is evident that the co-doping with SiC counterbalanced the negative effect on $T_c$ of the single element doping.

Figure 2:
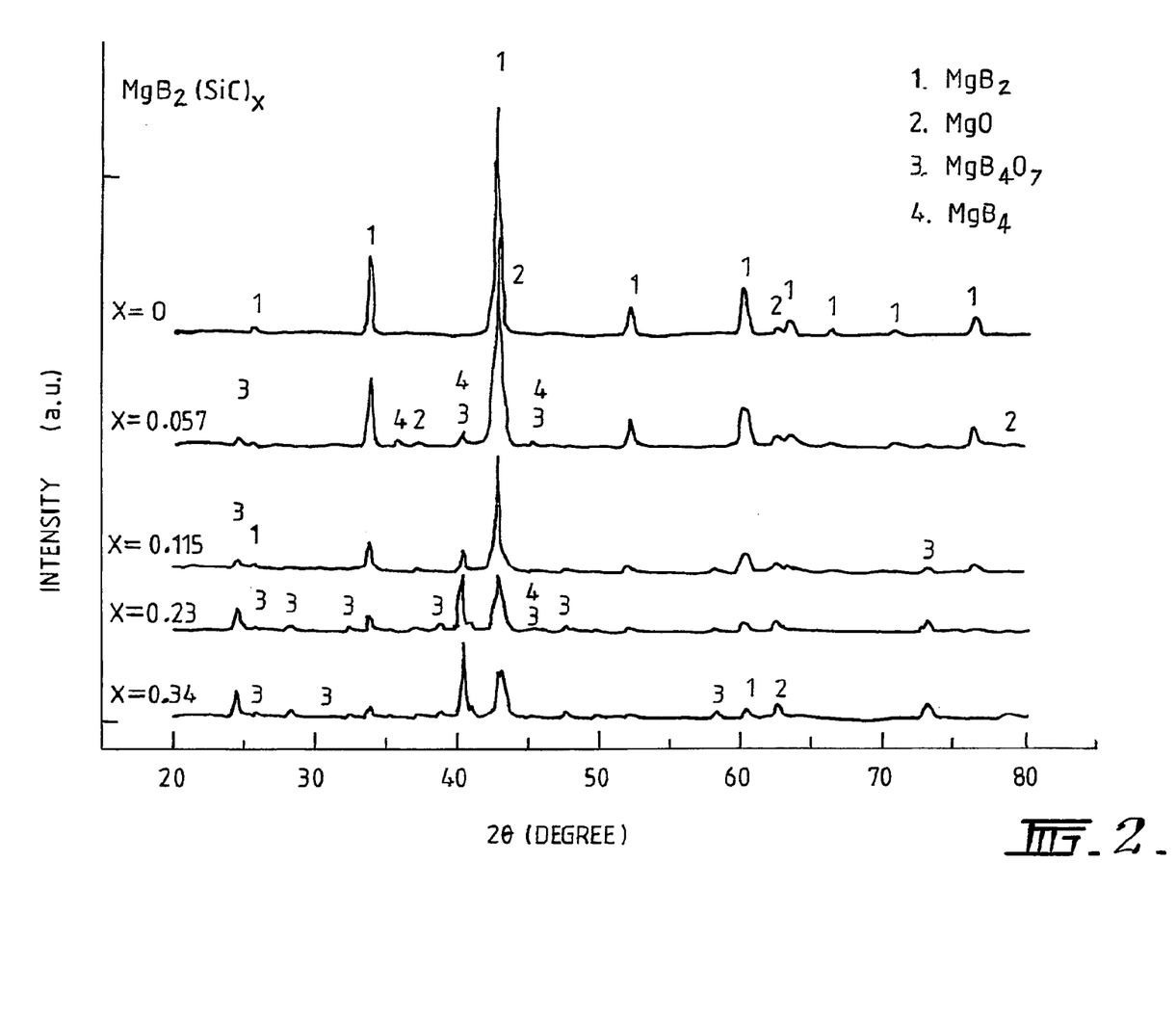
FIG. 2 is an image of X-ray diffraction patterns for the undoped and SiC-doped samples of a superconducting material in accordance with an embodiment of the present invention.
Figure 3:
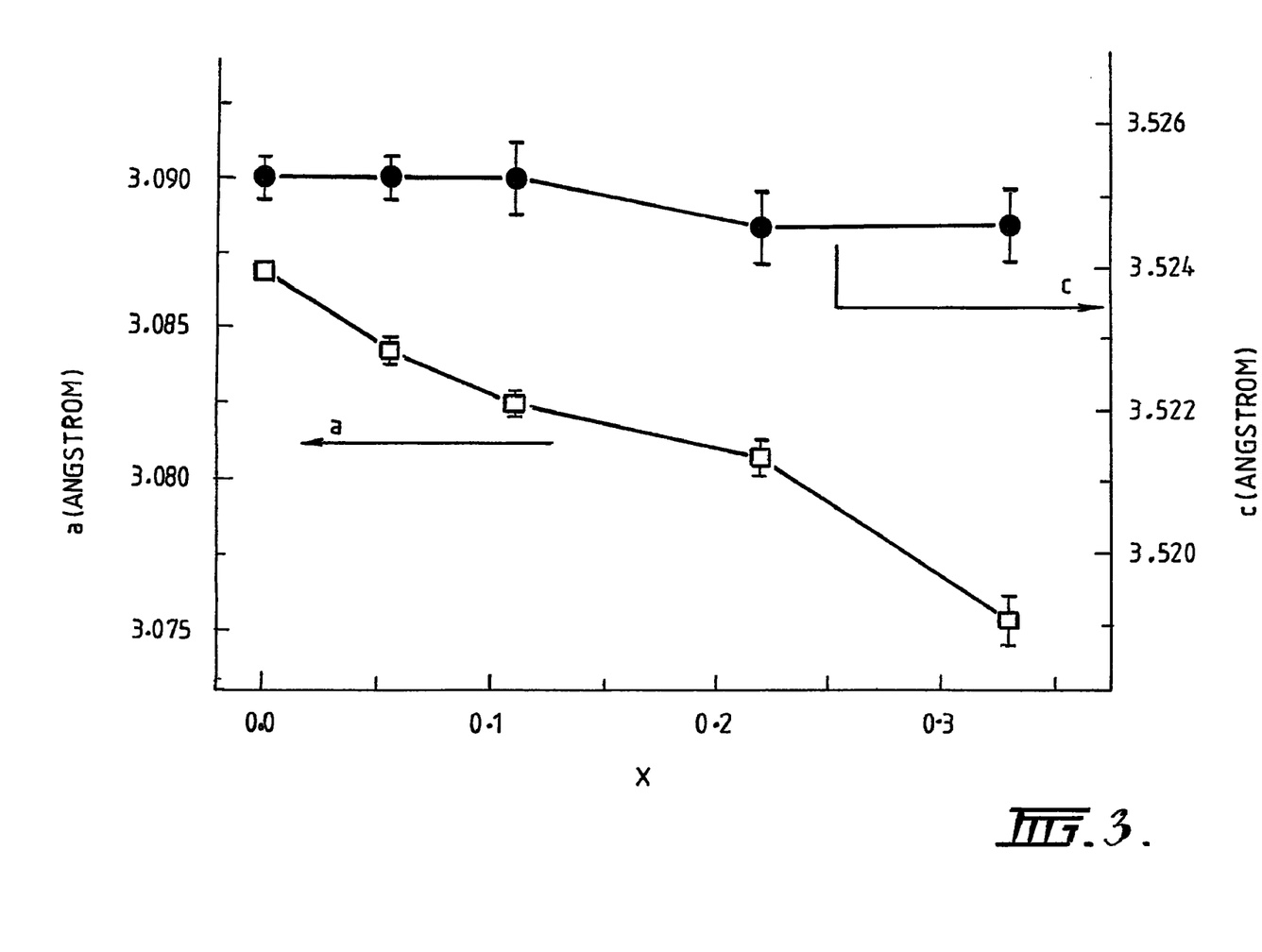
FIG. 3 is a graph depicting the lattice parameters 'a' and 'c' plotted as a function of the SiC content x of a superconducting material in accordance with an embodiment of the present invention.

FIG. 2 depicts x-ray diffraction patterns for SiC doped and undoped samples of an $MgB_2$ superconductor. The X-ray scans were recorded using $Cu_{K\alpha}$=1. 5418 Å, and indexed within the space group P6/mmm. For the in-phase reflection which occurs in FIG. 1 between 2θ=33° and 2θ=34° (indexed as (100)), the centroid of the peak clearly shifts to higher 2θ values with increasing x, while simultaneously the centroid of the peak occurs between 2θ=51° and 2θ=52°, (indexed as (002)), and the shift is marginal to higher 2θ values with increasing x. The lattice parameters, a and c of the hexagonal $AlB_2$-type structure of $MgB_2$ were calculated using these peak shifts as shown in FIG. 3. Note that the $MgB_4$, MgO and $MgB_4O_7$ peaks increased significantly with increasing SiC. The continuous decrease of 'a' with increasing SiC doping level indicates that B was substituted by C and Si. C substitution for B reached saturation at 7 at % of B [19] while the co-doping of Si and C for B raised the saturation level. At x=0.055, the sample consists of a major phase with $MgB_2$ structure and minority phases: $MgB_4$, MgBO and MgO. The appearance of $MgB_4$ may be attributable to the substitution of SiC for B position, resulting in an excess of B. Some extra B was incorporated into MgO to form MgBO. It is also noted that all three non-superconducting phases increased with increasing SiC dopant. At x=0.22, the amount of non-superconducting phases exceeded $MgB_2$. The extra oxygen may be brought in by the SiC dopant which absorbed moisture or oxygen during storage. There are no SiC peaks indexed up to a value of x=0.33.

Note that in FIG. 3 the axis decreases with increasing SiC dopant and did not reach saturation at x=0.33. The total variation of the axis from x=0 to x=0.33 is 0.012 A. In comparison, with single element doping with C, the axis reached a plateau at a C content of 7 at % of B where the variation of the axis is 0.016 A. This indicates that co-doping of Si and C into $MgB_2$ substantially reduced the variation of axis due to the counterbalance effect of Si and C. This also explains why the $T_c$ drops very slow with increasing SiC dopant.

Figure 5:
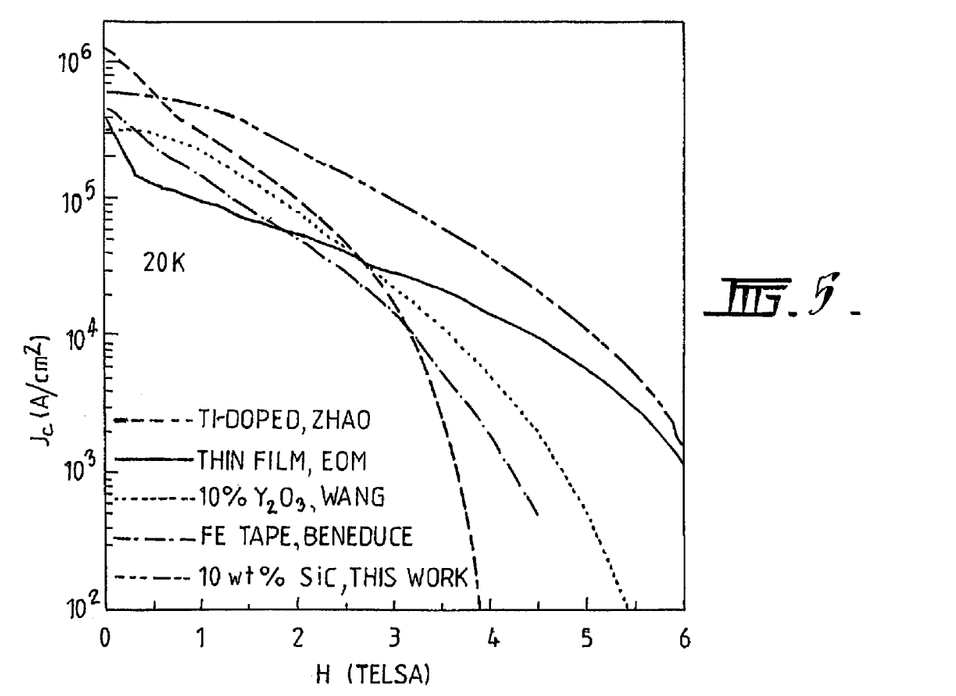
FIG. 5 is a graph which depicts the comparative values of critical current density ($J_c$ (H)) as a function of applied magnetic field for SiC doped samples of a superconducting material in accordance with an embodiment of the present invention at a doping value of x=0.115 at 20 K with those for Ti doped [12], $Y_2O_3$ doped [13], thin film with strong pinning [11] and Fe-sheathed tape [15], which represent the state-the-art performance of $MgB_2$ in various forms.

FIG. 5 shows the $J_c(H)$ curves for doped and undoped samples at temperatures of 5 K (graph a) and 10 K (graph b). These results show the following striking features. The $J_c(H)$ curves for undoped samples show a crossover with those for all the doped sample at higher fields. Although SiC doping at x values of greater than 0.22 caused a reduction of $J_c$ at low fields, it is important to note that the $J_c$ for all doped samples drops with increasing field much more slowly than for the undoped sample. In particular, $J_c$ curves for doped samples with x values of 0.22 and 0.33 show an exponential relationship with the applied magnetic field up to the measurement field limit, while the $J_c$ curve for the undoped sample shows a rapid downward bend. The $J_c$ for the doped sample at a value of x=0.11 reached $1.3 \times 10^5$ $A/cm^2$ at 4 T and increased to a value more than 30 times that of the undoped sample at a field strength of 6 T and a temperature of 5 K. It is also interesting to note that at temperatures of 5 K and 10 K, $J_c(H)$ for higher doping level samples (4 and 5) declined faster than those of low doping samples (2 and 3). However, at 20 K all doped samples showed nearly parallel $J_c(H)$ curves while at 30 K, the x=0.33 doped sample showed an even slower $J_c$ drop with field relative to the other samples, indicating the presence of a stronger pinning enhancement effect at higher temperatures.

Figure 4:
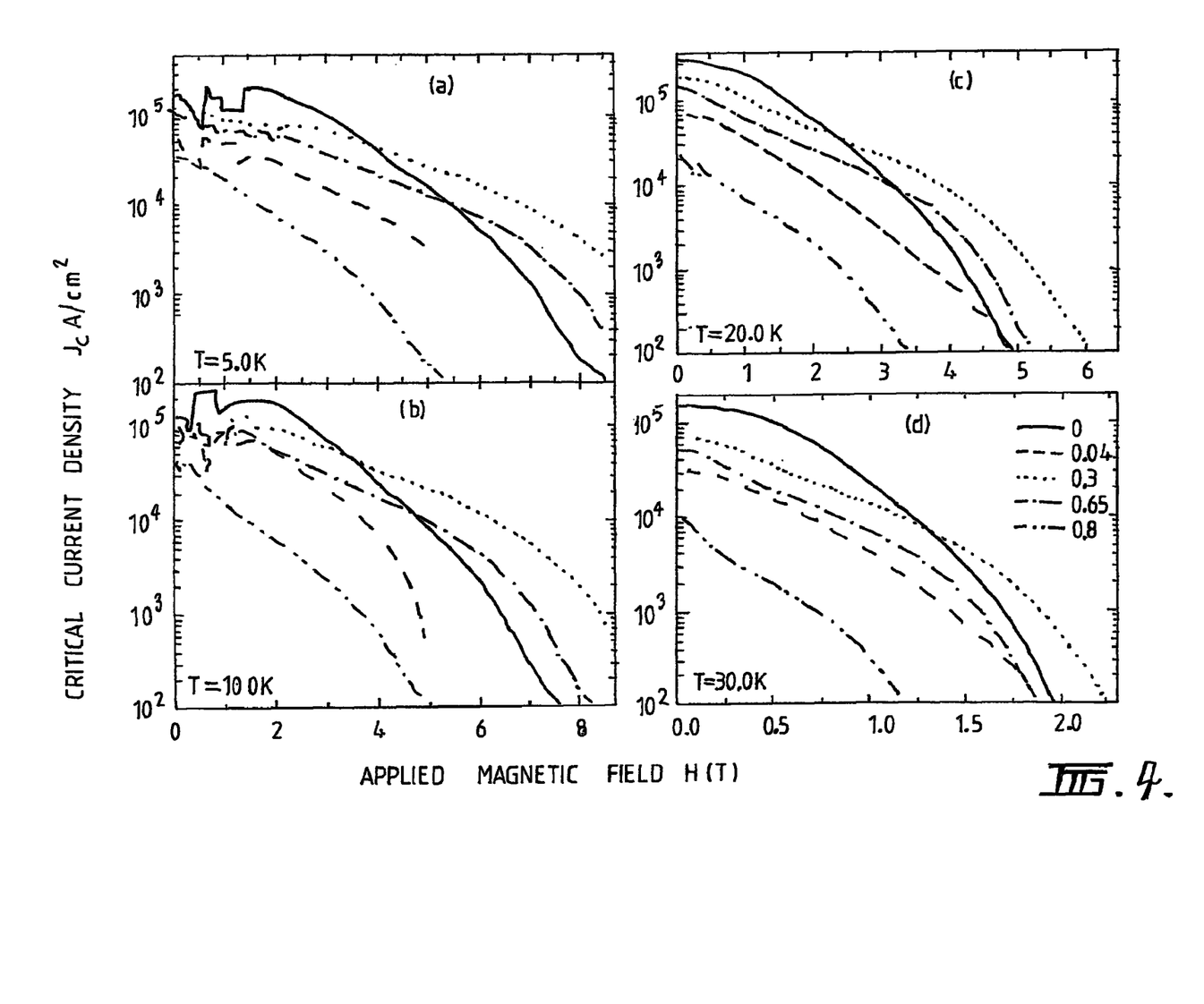
FIG. 4 is a graph depicting the effect of SiC doping on the critical current density as a function of applied magnetic field (i.e., the $J_c$-H dependence) at a temperature of 5 K (graph a), 10 K (graph b) 20 K (graph c) and 30 K (graph d) for five samples at doping level ranging from x=0 to x=0.33.
Figure 6:
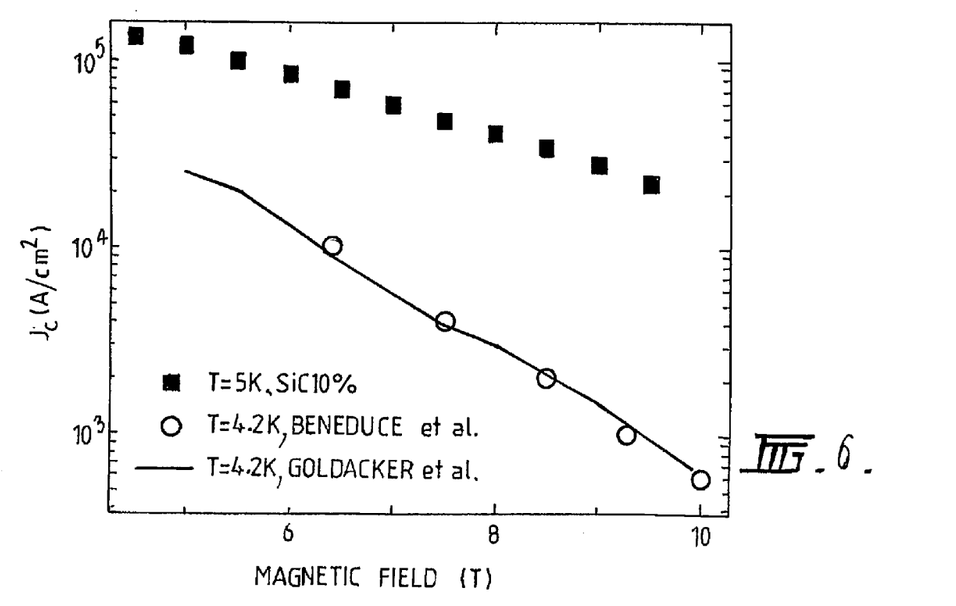
FIG. 6 is a graph depicting the transport critical current density as a function of applied magnetic field for an SiC doped sample of a superconductor in accordance with an embodiment of the present invention, for a value of x=0.11 measured at a temperature of T=5 K, compared to prior art $MgB_2$ superconductors measured at a temperature of T=4.2 K.

FIG. 4 depicts a comparison of the $J_c$-H behavior for an x=0.11 SiC doped sample with data reported from literature at various temperatures. It is evident that despite the low density and unoptimized composition, the $J_c$ for the SiC doped sample drops slower than other element doped samples [12, 13], the best $Fe/MgB_2$ tape [15] and even close to the thin film with strong pinning [11]. At 20 K, the sample with x=0.11 has a $J_c$ value of 18,000 $A/cm^2$ at 4 T, 100 times the control sample which was made at the same batch, 8 times that of the state-the-art $Fe/MgB_2$ tape [15]. These are the best $J_c$ values ever reported for bulk and wires made under normal conditions. The $H_{irr}$ for x=0.11 doped sample is 6 T at 20 K and 8 T at 10 K, compared to 4 T and 6 T of the undoped one, respectively. A further comparison is shown in FIG. 6, where the results of transport current measurements are shown for one of the most optimal SiC-doping levels and the best $MgB_2$ samples found in the literature. As can be seen, there is a striking difference between the two curves. Moreover, the SiC-doped sample is measured at a temperature of 5 K, whereas the other samples are measured at a temperature of 4.2 K. In other words, the actual enhancement induced by SiC-doping is even larger than the best $MgB_2$ samples found in the literature.

Regarding the mechanism of the enhancement of $J_c$ at higher fields, it is necessary to recognize the special features of SiC doping.

Firstly, in contrast to previous work on doping for improving $J_c$ [12-14], SiC doping has no densification effect, as evidenced by the fact that the density of doped samples is 1.2 $G/cm^2$, independent of doping level. This is understandable because SiC has a very high melting point and would not act as a sintering aid at temperatures in the range of 800° C. to 950° C.

Secondly, SiC doping takes place in the form of substitution and/or addition while in the prior art [14-16] the element doping is in the form of additives, which are not incorporated into the lattice structure. Doping $MgB_2$ with Ti and Zr showed an improvement of $J_c$ in self field and 4 K [12]. However, there is evidence for improved pinning as the $J_c$ drops off rapidly with increasing field ($H_{irr}$=4 T at 20 K). Doping $MgB_2$ using $Y_2O_3$ nanoparticles showed an improvement of irreversibility field ($H_{irr}$) at 4.2 K, but $H_{irr}$ for the doped samples is not as good as the undoped ones at 20 K [13]. Cimerle et al., found that doping with a small amount of Li, Al and Si showed some increase in $J_c$, but there is no improvement in $H_{irr}$ [14]. It is evident that the additive pinning is more effective at low temperatures while the additives at the grain boundaries decouple the grains at high temperatures.

Figure 7A:
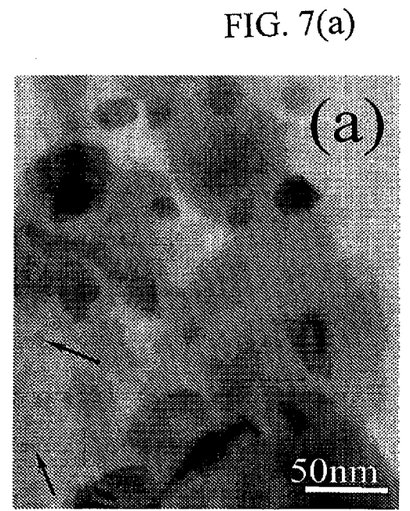
FIGS. 7a and 7b are a transmission electron microscope (TEM) images depicting the high density dislocations within the grains and FIG. 7c is an energy dispersive X-ray (EDX) analysis map showing the incorporation of C and Si into the grains of $MgB_2$.
Figure 7B:
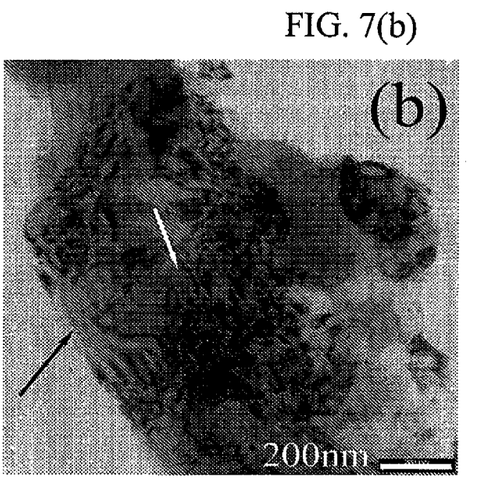
Figure 7C:
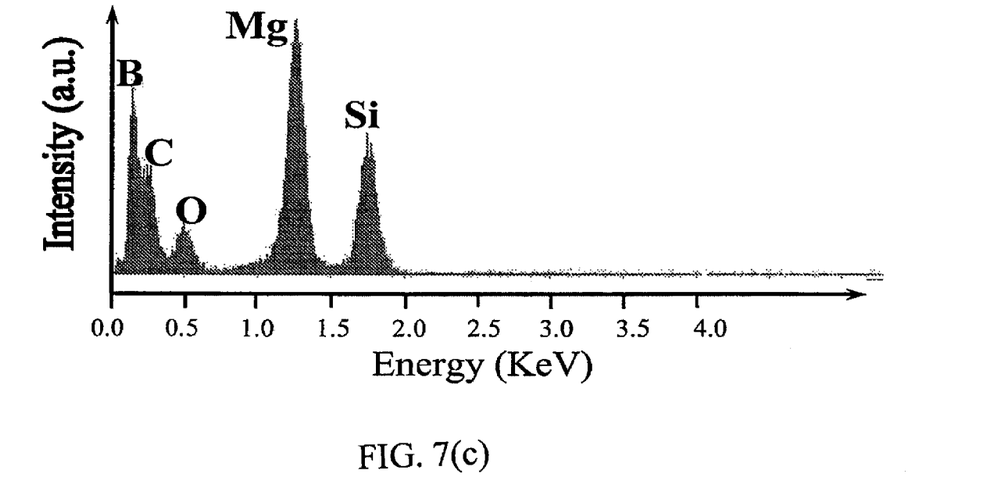

The applicant postulates that there are two potential pinning mechanisms in the SiC doped samples. The first is intrinsic pinning due to substitution and impurity pinning (or a combination thereof). The high fraction of substitution by both Si and C can result in lattice defects, which are capable of acting as effective pinning sites which are intrinsic in nature and independent of temperature. The high content of MgO and other impurity phases in the SiC doped samples could also be potential pinning centers, consistent with the results obtained from a thin film with strong pinning where the ratio of Mg; B:O reached 1.0:0.9:0.7 [11]. The applicant has attempted to dope fine particle MgO into $MgB_2$. However, the results did not show any improvement in $J_c$. From this result, it is theorized that the manner in which the impurities are introduced may be critical. When SiC reacts with liquid Mg and amorphous B at the sintering temperatures, the nanoparticles may act as nucleation sites to form $MgB_2$ and other phases. Some nanoparticles may be included within the grains as inclusions. Thus, the reaction induced products are highly dispersed in the bulk matrix. These arguments are supported by the study of microstructures. TEM examination revealed that the grain size is smaller than 100 nm. The EDX analysis results showed that the Mg:Si ratio is identical across the entire sample area, indicating that the phase distribution is homogeneous. The results of the present work suggest that a combination of substitution and highly dispersed additives induced through the substitution is responsible for the enhanced flux pinning in SiC-doped $MgB_2$. The substitution induced defects and order parameter fluctuation may play a more important role than the impurity pinning.

It should be noted that the density of the samples is only about 1.2 $g/cm^3$. Thus, the $J_c$ values for both the doped and undoped samples are far from optimum. The applicant anticipates that a higher $J_c$ and better flux pinning enhancement can be achieved if the density of the samples is further improved.

From the study of effect of the purity of the precursor materials, it is noted that even 95% pure B degraded the $J_c$ appreciably. Therefore, it is necessary to use high purity B (98% or above). The cost for B increases significantly with increasing purity. The main cost for making $MgB_2$ conductors will be the high purity B. Since C and Si are abundant, inexpensive and readily available materials, then if a portion of B can be replaced by co-doping with C and Si or SiC, the overall cost for making $MgB_2$ conductors will preferably be reduced. Furthermore, the SiC doping has already shown a significant benefit in enhancing flux pinning. It is evident that it is advantageous for $MgB_2$ conductors to be made using a formula of $MgB_xSi_yC_z$ where $x+y+z\geqq2$, instead of pure $MgB_2$.

In summary, the applicant contends that the critical current density, irreversibility field and flux pinning properties of $MgB_2$ in bulk form can be significantly improved by a readily achievable and economically viable chemical doping with SiC, which may allow $MgB_2$ to potentially replace NB—Ti, the current market leader in superconducting materials.

TABLE 1

| Sample No | SiC wt % | At. Ratio $MgB_2$:SiC | Density $G/cm^2$ | $T_{c(0)}$ (K) | H (T) 10 K | H (T) 20 K | H (T) 25 K | H (T) 30 K |
|---|---|---|---|---|---|---|---|---|
| 1 | 0 | 1:0 | 1.20 | 38.6 | 6.2 | 4.0 | 3.6 | 2.2 |
| 2 | 5 | 1:0.055 | 1.21 | 37.8 | 7.2 | 5.1 | 4.0 | 2.5 |
| 3 | 10 | 1:0.11 | 1.22 | 36.8 | 8.0 | 5.8 | 4.5 | 2.5 |
| 4 | 20 | 1:0.22 | 1.17 | 36.6 | 5.5 | 3.7 | 3.5 | 1.8 |
| 5 | 30 | 1:0.33 | 1.30 | 36 | 5.2 | 4.0 | 3.2 | 2.5 |

Example 1

Synthesis of $(Mg+2B)_{1-x}(SiC)_x$ through nanoparticle SiC doping into $MgB_2$ $(Mg+2B)_{1-x}(SiC)_x$ samples were prepared by a reaction in-situ method. Powders of magnesium (99% purity) and amorphous boron (99% purity) were well mixed with SiC additive with the atomic ratio of $(Mg+2B)_{1-x}(SiC)_x$ where x=0, 0.057, 0.117, 0.23 and 0.34 for samples 1 to 5 respectively (Table 1). The mixed powders were loaded into Fe tubes. The composite tubes were groove-rolled, sealed in a Fe tube and then directly heated at preset temperatures to 950° C. for 3 hours, in the presence of flowing high purity Ar. This was followed by quenching to liquid nitrogen temperature. Table 1 provides information, with samples 1, 2, and 3 being the undoped and doped with 5 wt % and 10 wt % MgO respectively.

The magnetization of $1.0\times1.0\times0.8$ $mm^3$ samples was measured over a temperature range of 5 to 30 K using a Physical Property Measurement System (PPMS, Quantum Design) in a time-varying magnetic field of sweep rate 50 Oe/s and amplitude 9 T. A magnetic Jc can be derived from the height of the magnetization loop $\Delta M$ using a suitable variant of the "semi-Bean" relationship $\Delta M=k\ J_c d$, where k is a constant and d is the thickness that the sample presents to the applied field. Based on the full sample size, the magnetic current density $J_c$ is calculated using the relationship for a plate in a perpendicular field: $Jc=20\Delta M/(a-a^2/3b)$. $J_c$ versus magnetic field up to 9 T for the samples at 5 K, 10 K, 20 K, and 30 K has been measured. Due to flux jumping, the low field $J_c$ at values below 10 K cannot be measured. The results are displayed in Table 1.

Example 2

Synthesis of $MgB_{2-x}(SiC)_x$ using nanoparticle SiC to react with Mg and B $MgB_{2-x}(SiC)_x$ samples were prepared by a reaction in-situ method. Powders of magnesium (99% purity) and amorphous boron (99% purity) were thoroughly mixed with SiC additive, to prepare various samples with the following ratios of $MgB_{2-x}(SiC)_x$: X=0, 0.02, 0.05, 0.1, 0.15, 0.2, 0.5, 1.0, 1.5 and 2.0. The mixed powders were loaded into Fe tubes. The composite tubes were groove-rolled, sealed in a Fe tube and then directly heated at preset temperatures to 900° C., for 3 hours in the presence of flowing high purity Ar. This was followed by quenching to liquid nitrogen temperature.

Example 3

Synthesis of $MgB_{2-x-y}Si_xC_y$ using Mg, B, Si and C powders $MgB_2$ pellet samples were prepared by a reaction in-situ method. Powders of magnesium (99% purity) and amorphous boron (99% purity) were well mixed with SiC additive with the ratio of $Mg+B_{2-x}(SiC)_x$ where x=0, 0.02, 0.05, 0.1, 0.15, 0.2, 0.5, 1.0, 1.5 and 2.0. The mixed powders were loaded into Fe tubes. The composite tubes were groove-rolled, sealed in a Fe tube and then directly heated at preset temperatures to 900° C., for 3 hours in flowing high purity Ar. This was followed by quenching to liquid nitrogen temperature.

Example 4

Synthesis of $MgB_{2-x-y}Ti_xC_y$ using Mg, B, TiC powders $MgB_2$ pellet samples were prepared by a reaction in-situ method. Powders of magnesium (99% purity) and amorphous boron (99% purity) were well mixed with TiC additive with the ratio of $Mg+B_{2-x}(TiC)_x$ where x=0, 0.05, 0.1, 0.15, 0.2, 0.5, 1.0. The mixed powders were loaded into Fe tubes. The composite tubes were groove-rolled, sealed in a Fe tube and then directly heated at preset temperatures to 950° C., for 3 hours in the presence of flowing high purity Ar. This was followed by furnace cooling to room temperature.

Example 5

Synthesis of $MgB_{2-x}C_x$

Polycrystalline samples of $MgB_{2-x}C_x$ were prepared through a reaction in-situ method. High purity powders of magnesium (99% purity), amorphous boron (99% purity) and carbon nano-particles (with a particle size of about 20 nm) were weighed out according to the nominal atomic ratio of $MgB_{2-x}C_x$ with x=0, 0.05, 0.1, 0.2, 0.3, 0.4 and well-mixed through grinding. The powders were pressed into pellets of 10 mm in diameter and 3 mm in thickness using a hydraulic press. The pellets were sealed in Fe tubes, then heat treated at 770° C. for 30 min. in flowing high purity Ar. This was followed by a furnace cooling to room temperature. An undoped sample was also made under the same conditions for use as a reference sample. The phase and crystal structure of all the samples was obtained from X-ray diffraction (XRD) patterns using a Philips (PW1730) diffractometer with CuKα radiation. Si powder was used as a standard reference to calculate the lattice parameters. The results show that both the a-axis lattice parameter and the $T_c$ decreased monotonically with increasing doping level. For the sample doped with the highest nominal composition of x=0.4 the $T_c$ dropped only 2.7 K. The nano-C-doped samples showed an improved field dependence of the Jc compared with the undoped sample over a wide temperature range. The enhancement by C-doping is similar to that of Si-doping but not as strong as for nano-SiC doped $MgB_2$. X-ray diffraction results indicate that C reacted with Mg to form nano-size $Mg_2C_3$ and $MgB_2C_2$ particles. Nano-particle inclusions and substitution, both observed by transmission electron microscopy, are proposed to be responsible for the enhancement of flux pinning in high fields.

Example 6

Synthesis of $MgB_{2-x}Si_x$

Polycrystalline samples of $MgB_{2-x}Si_x$ were prepared through a reaction in-situ method. High purity powders of magnesium (99% purity), amorphous boron (99% purity) and silicon nano-particles (with a particle size of about 20-40 nm) were weighed out according to the nominal atomic ratio of $MgB_{2-x}Si_x$ with x=0, 0.05, 0.1, 0.2, 0.3, 0.4 and well-mixed through grinding. The powders were pressed into pellets of 10 mm in diameter and 3 mm in thickness using a hydraulic press. The pellets were sealed in Fe tubes, then heat treated at 800-900° C. for 30 min. in flowing high purity Ar. This was followed by a furnace cooling to room temperature. An undoped sample was also made under the same conditions for use as a reference sample.

Although the above embodiments specifically relate to magnesium diboride superconducting material it is possible that silicon carbide co-dopant could be useful for other superconducting materials.

A suitable process for utilizing the superconducting material of the present invention would be as follows:
- Mixing powders of precursor materials as discussed above.
- Ball milling the mixture to achieve homogeneity.
- Loading the mixture in to metal or alloy dies, containers, tubes for forming and shaping, the metals including iron, stainless steel, nickel and various alloys.
- Making the mixtures or the composites in to bulk, wires, tapes and various shaped articles and devices through mechanical deformation including pressing, drawing, rolling, swaging and casting etc.
- Sintering the composites at temperatures of 650° C. to 1000° C. for 10 minutes to 10 hours, preferably at 800 to 950° C. for 10 minutes to 3 hours.

Modifications and variations as would be apparent to a skilled addressee are deemed to be within the scope of the present invention.

REFERENCES

1. J. Nagamatsu, N. Nakagawa, T. Muranaka, Y. Zenitani, and J. Akimitsu. Nature, 410 (2001) 63.
2. S. L. Bud'ko et al., Phys. Rev. Lett., 86 (2001) 1877.
3. D. C. Larbalestier et al. Nature 410 (2001) 186.
4. Y. Boguslaysky et al., Nature 410 (2001) 563.
5. S. X. Dou et al., Physica C, 361 (2001) 79.
6. W. Goldache et al., Supercond. Sci. Technol., 14 (2001) 787
7. R. Flukiger et al., Physica C, 385 (2002) 286.
8. S. Jin et al, Nature, 411 (2001) 563.
9. W. N. Kang et al., Science 292 (2001) 1521-3.
10. C. B. Eom et al., Nature, 411 (2001) 558.
11. Y. Bugoslaysky et al., Nature 411 (2001) 561.
12. Y. Zhao et al, Appl. Phys. Lett., 79 (2001) 1155.<BR><P>
13. J. Wang et al., Appl. Phys. Lett., 81 (2002) 2026.<BR><P>
14. M. R. Cimberle et al., Supercond. Sci. Tech. 15 (2002) 34.
15. C. Beneduce, H. L. Suo, P. Toulemonde, N. Musolino, and R. Flukiger, Cond-mat/0203551.
16. X. L. Wang, S. Soltanian et al., Physica C, 361 (2001) 149.
17. W. Mickelson, J. Cumings, W. Q. Han and A. Zettl, Phys. Rev. B 65 (2002) 052505-1.
18. T. Prikhna, W. Gawalek, N. Novikov et al., Cond-mat
19. S. H. Zhou, A. Pan, J. Horvat, X. L. Wang, H. K. Liu and S. X. Dou, "Effect of precursor purity on critical current density of $MgB_2$., under preparation.

The invention claimed is:

1. A method of synthesizing a superconducting material, comprising:
    mixing starting materials comprising Mg, B, Si and C;
    heating the mixture of starting materials to a temperature in the range between 650° C. and 1000° C. to produce a material comprising magnesium boride doped with silicon carbide; and
    cooling the material comprising magnesium boride doped with silicon carbide to a temperature below the critical temperature of the material to render the material capable of superconducting.

2. The method in accordance with claim 1, wherein the resulting material has a formula $MgB_x(SiC)_y$, where
    X is a number greater than 0 and less than or equal to 2, and
    Y is a number greater than 0 and less than or equal to 2.

3. The method in accordance with claim 2, wherein X equals 2, and Y is a number greater than or equal to 0.055 and less than or equal to 0.33.

4. The method in accordance with claim 2, wherein X is a number greater than or equal to 0.5 and less than or equal to 1.98, and Y is a number greater than or equal to 0.02 and less than or equal to 1.5.

5. The method in accordance with claim 4, wherein the values for X and Y are selected from the group consisting of: X equal to 1.98 and Y equal to 0.02, X equal to 1.95 and Y equal to 0.05, X equal to 1.9 and Y equal to 0.1, X equal to 1.85 and Y equal to 0.15, X equal to 1.8 and Y equal to 0.2, X equal to 1.5 and Y equal to 0.5, X equal to 1.0 and Y equal to 1.0, and X equal to 0.5 and Y equal to 1.5.

6. A method of synthesizing a superconducting material, comprising:
    mixing starting materials comprising $MgB_2$ and SiC;
    heating the mixture of starting materials to a temperature in the range between 650° C. and 1000° C. to produce a material comprising magnesium boride doped with silicon carbide; and
    cooling the material comprising magnesium boride doped with silicon carbide to a temperature below the critical temperature of the material to render the material capable of superconducting.

7. A method of synthesizing a superconducting material, comprising:
    mixing starting materials comprising $MgB_2$, Si and C;
    heating the mixture of starting materials to a temperature in the range between 650° C. and 1000° C. to produce a material comprising magnesium boride doped with silicon carbide; and
    cooling the material comprising magnesium boride doped with silicon carbide to a temperature below the critical temperature of the material to render the material capable of superconducting.

8. The method in accordance with claim 1, 6 or 7, wherein the starting materials are powders.

9. The method in accordance with claim 8, wherein the powders consist of nanoparticles.

10. The method in accordance with claim 1, 6 or 7, wherein the mixture is heated to a temperature in the range of 900-950° C.

11. The method in accordance with claim 1, 6 or 7, wherein the material comprising magnesium boride doped with silicon carbide is cooled to a temperature of liquid nitrogen.

12. The method in accordance with claim 1, 6 or 7, wherein the superconducting material is produced in the form of a bulk, pellet, wire, thin film or tape.

13. The method of manufacturing the superconducting material in a form of a pellet according to claim 12, comprising:
   mixing powders of starting materials by grinding or milling;
   pressing the resulting mixture into pellets;
   loading the pellets into an iron tube;
   heating the iron tube in an inert gas atmosphere to a temperature in a range of about 650° C. to about 950° C. for a term of about 10 minutes to about 10 hours; and
   cooling the resulting superconducting material.

14. The method in accordance with claim 13, wherein the cooling of the resulting superconducting material is provided by quenching with liquid nitrogen.

15. The method of manufacturing the superconducting material in a form of a wire according to claim 12, comprising:
   mixing powders of starting materials by grinding or milling;
   loading the resulting mixture into an iron tube;
   groove-rolling the iron tube into wire;
   heating the iron tube in an inert gas atmosphere to a temperature range of about 650° C. to about 950° C. for a term of about 10 minutes to about 10 hours; and
   cooling the resulting superconducting material to room temperature.

16. The method in accordance with claim 15, wherein the cooling of the resulting superconducting materials is provided by quenching with liquid nitrogen.

17. The method in accordance with claim 1, 6 or 7, wherein the superconducting material is capable of carrying a current of at least 10,000 A/cm$^2$ in a magnetic field above 8 Tesla and at temperature of 5 Kelvin.

18. The method in accordance with claim 1, 6 or 7, wherein the superconducting material is capable of carrying a current at a current density of at least one order of magnitude higher than undoped MgB$_2$ in a magnetic field above 8 Tesla and at temperature of 5 Kelvin.

19. The method in accordance with claim 6 or 7, wherein the resulting material has a formula MgB$_x$(SiC)$_y$, where
   X is a number greater than 0 and less than or equal to 2, and
   Y is a number greater than 0 and less than or equal to 2.

20. The method in accordance with claim 19, wherein X equals 2, and Y is a number greater than or equal to 0.055 and less than or equal to 0.33.

21. The method in accordance with claim 19, wherein X is a number greater than or equal to 0.5 and less than or equal to 1.98, and Y is a number greater than or equal to 0.02 and less than or equal to 1.5.

22. The method in accordance with claim 21, wherein the values for X and Y are selected from the group consisting of: X equal to 1.98 and Y equal to 0.02, X equal to 1.95 and Y equal to 0.05, X equal to 1.9 and Y equal to 0.1, X equal to 1.85 and Y equal to 0.15, X equal to 1.8 and Y equal to 0.2, X equal to 1.5 and Y equal to 0.5, X equal to 1.0 and Y equal to 1.0, and X equal to 0.5 and Y equal to 1.5.

* * * * *